US008749235B2

(12) United States Patent  (10) Patent No.: US 8,749,235 B2
Iwama et al.  (45) Date of Patent: Jun. 10, 2014

(54) BIRDCAGE COIL FOR MAGNETIC RESONANCE IMAGING APPARATUS

(75) Inventors: Mina Iwama, Tokyo (JP); Yusuke Asaba, Tokyo (JP); Takashi Ishiguro, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 346 days.

(21) Appl. No.: 13/194,235

(22) Filed: Jul. 29, 2011

(65) Prior Publication Data
US 2012/0025833 A1 Feb. 2, 2012
US 2012/0212225 A9 Aug. 23, 2012

(30) Foreign Application Priority Data

Jul. 29, 2010 (JP) .................................. 2010-169901

(51) Int. Cl.
*G01V 3/00* (2006.01)
(52) U.S. Cl.
USPC ....................................................... 324/318
(58) Field of Classification Search
USPC ................................. 324/300–322
See application file for complete search history.

(56) References Cited

U.S. PATENT DOCUMENTS

| | | | | |
|---|---|---|---|---|
| 4,594,566 A | * | 6/1986 | Maudsley | 333/219 |
| 4,746,866 A | * | 5/1988 | Roschmann | 324/318 |
| 4,751,464 A | * | 6/1988 | Bridges | 324/318 |
| 4,939,465 A | * | 7/1990 | Biehl et al. | 324/318 |
| 5,543,711 A | * | 8/1996 | Srinivasan et al. | 324/318 |
| 5,557,247 A | * | 9/1996 | Vaughn, Jr. | 333/219 |
| 5,760,583 A | | 6/1998 | Sato et al. | |
| 6,029,082 A | * | 2/2000 | Srinivasan et al. | 600/422 |
| 6,043,658 A | * | 3/2000 | Leussler | 324/318 |
| 6,348,794 B1 | | 2/2002 | Nabetani et al. | |
| 6,462,636 B1 | * | 10/2002 | Overweg et al. | 335/299 |
| 6,591,128 B1 | * | 7/2003 | Wu et al. | 600/422 |
| 6,608,480 B1 | * | 8/2003 | Weyers | 324/318 |
| 6,958,607 B2 | * | 10/2005 | Vaughan et al. | 324/318 |
| 7,135,864 B1 | * | 11/2006 | McKinnon et al. | 324/318 |
| 7,276,909 B2 | | 10/2007 | Nukihara et al. | |
| 7,495,443 B2 | * | 2/2009 | Leussler et al. | 324/318 |

(Continued)

FOREIGN PATENT DOCUMENTS

| | | |
|---|---|---|
| JP | 04241837 | 8/1992 |
| JP | 07-222729 | 8/1995 |
| JP | 11056814 | 3/1999 |
| JP | 2007511315 A | 5/2007 |

OTHER PUBLICATIONS

Pucca, et al.; A dedicated coil configuration for hyperpolarized 129Xe imaging at 1.5 T; Rapid Biomedical GmbH; dated 2008; pp. 2.

(Continued)

*Primary Examiner* — Dixomara Vargas
(74) *Attorney, Agent, or Firm* — Armstrong Teasdale LLP

(57) ABSTRACT

A magnetic resonance imaging apparatus includes a bore configured to accommodate a subject therein, an RF coil positioned about the bore, and an RF shield positioned about the RF coil. The RF coil includes a first portion positioned adjacent a lower surface side of the bore and spaced a distance from the RF shield that is larger than a distance between a second portion of the RF coil and an upper surface side of the bore.

14 Claims, 10 Drawing Sheets

(56) References Cited

U.S. PATENT DOCUMENTS

| | | | |
|---|---|---|---|
| 7,501,823 B2* | 3/2009 | Nistler et al. | 324/318 |
| 7,683,623 B2* | 3/2010 | Zhai et al. | 324/318 |
| 7,714,577 B2* | 5/2010 | Viswanathan | 324/318 |
| 8,030,930 B2* | 10/2011 | Li et al. | 324/322 |
| 8,035,384 B2* | 10/2011 | Saha | 324/318 |
| 2001/0009369 A1 | 7/2001 | Shimo et al. | |
| 2002/0165447 A1* | 11/2002 | Boskamp et al. | 600/422 |
| 2003/0020476 A1* | 1/2003 | Duensing | 324/318 |
| 2003/0122546 A1* | 7/2003 | Leussler | 324/318 |

OTHER PUBLICATIONS

Notice for Reason for Rejection; Application No. JP2010-169901; dated Jun. 11, 2012; pp. 3.

* cited by examiner

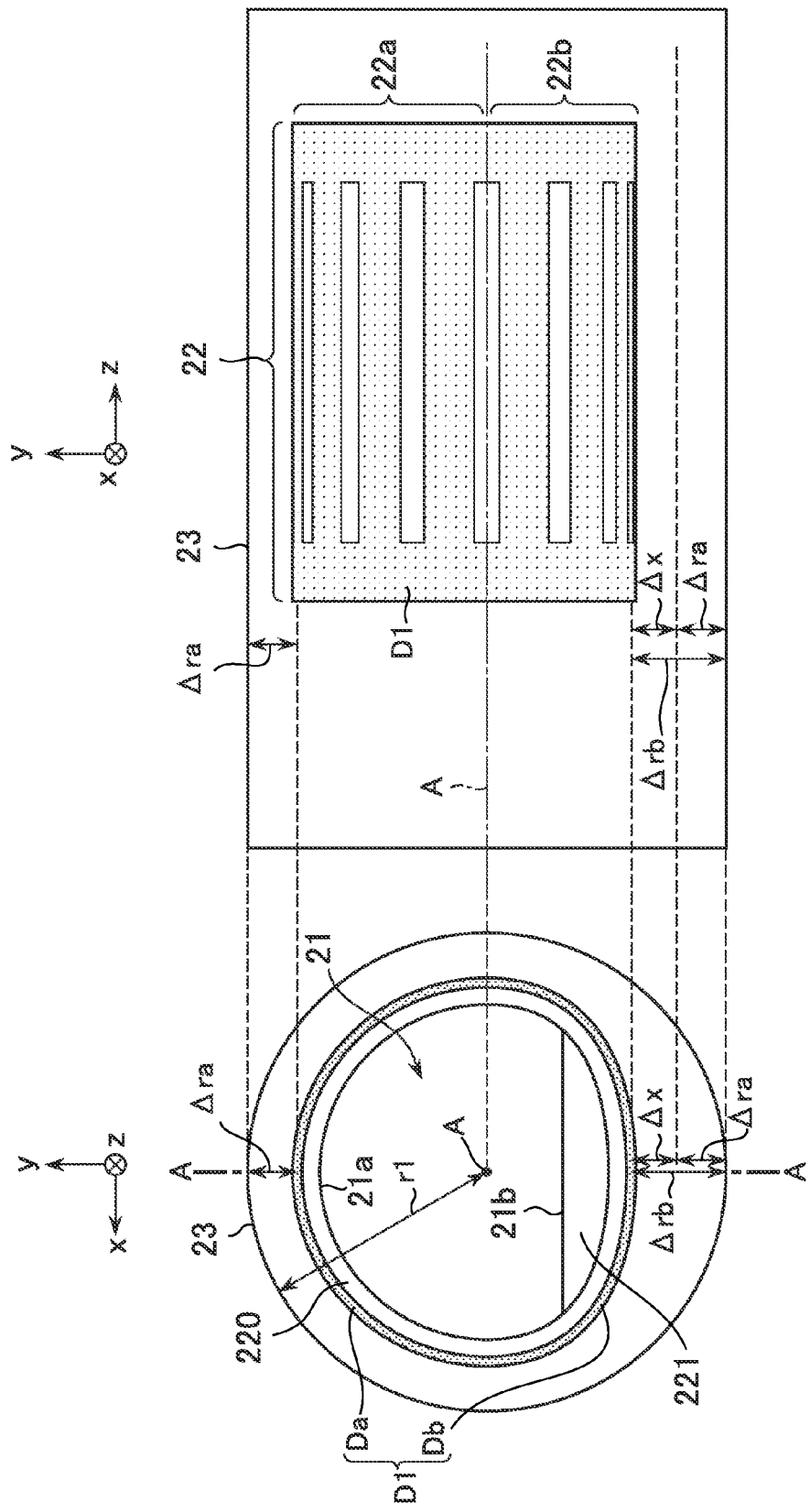

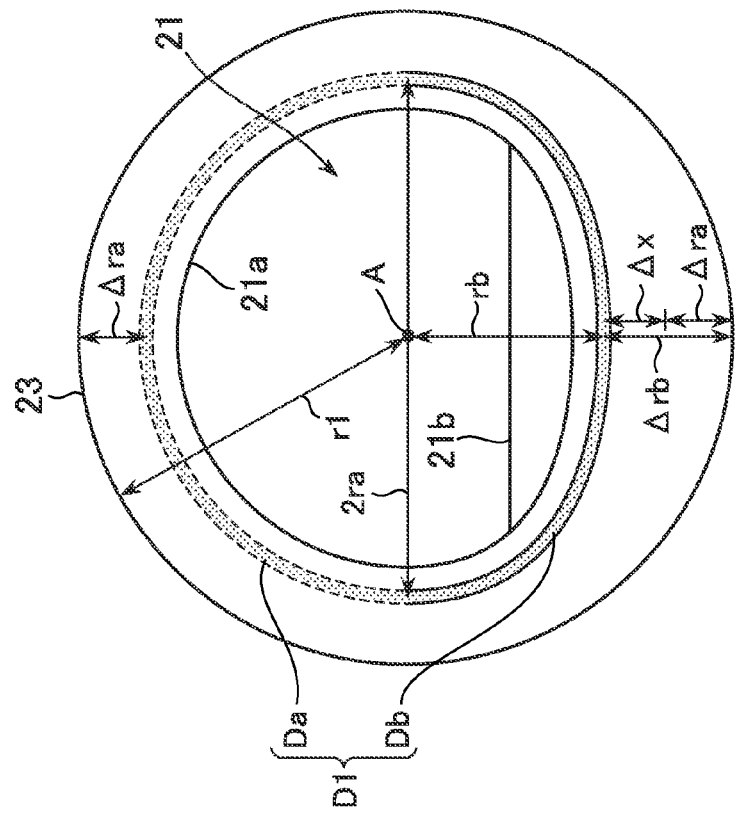
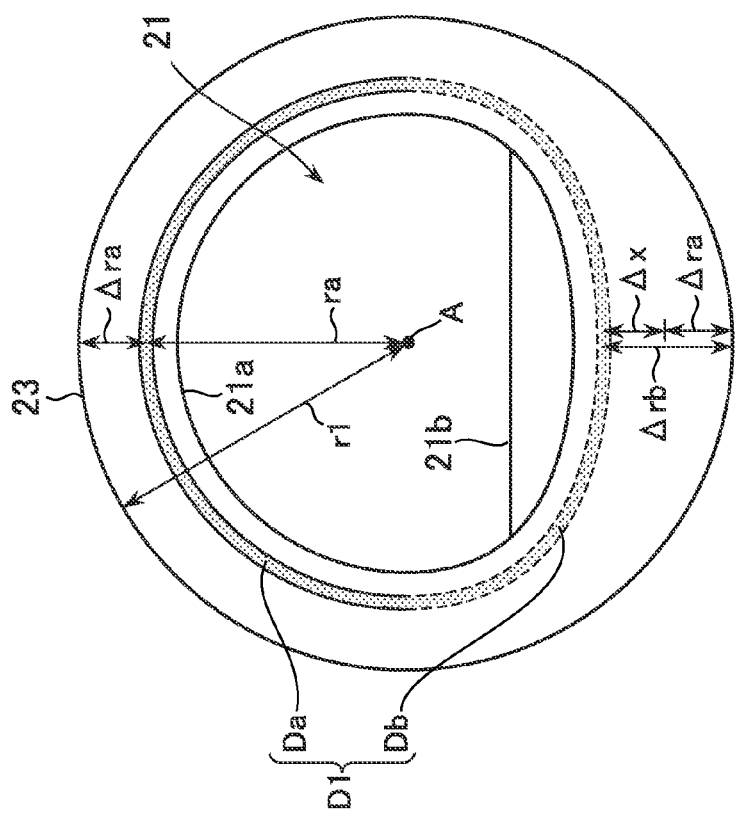
FIG. 6(a)
FIG. 6(b)

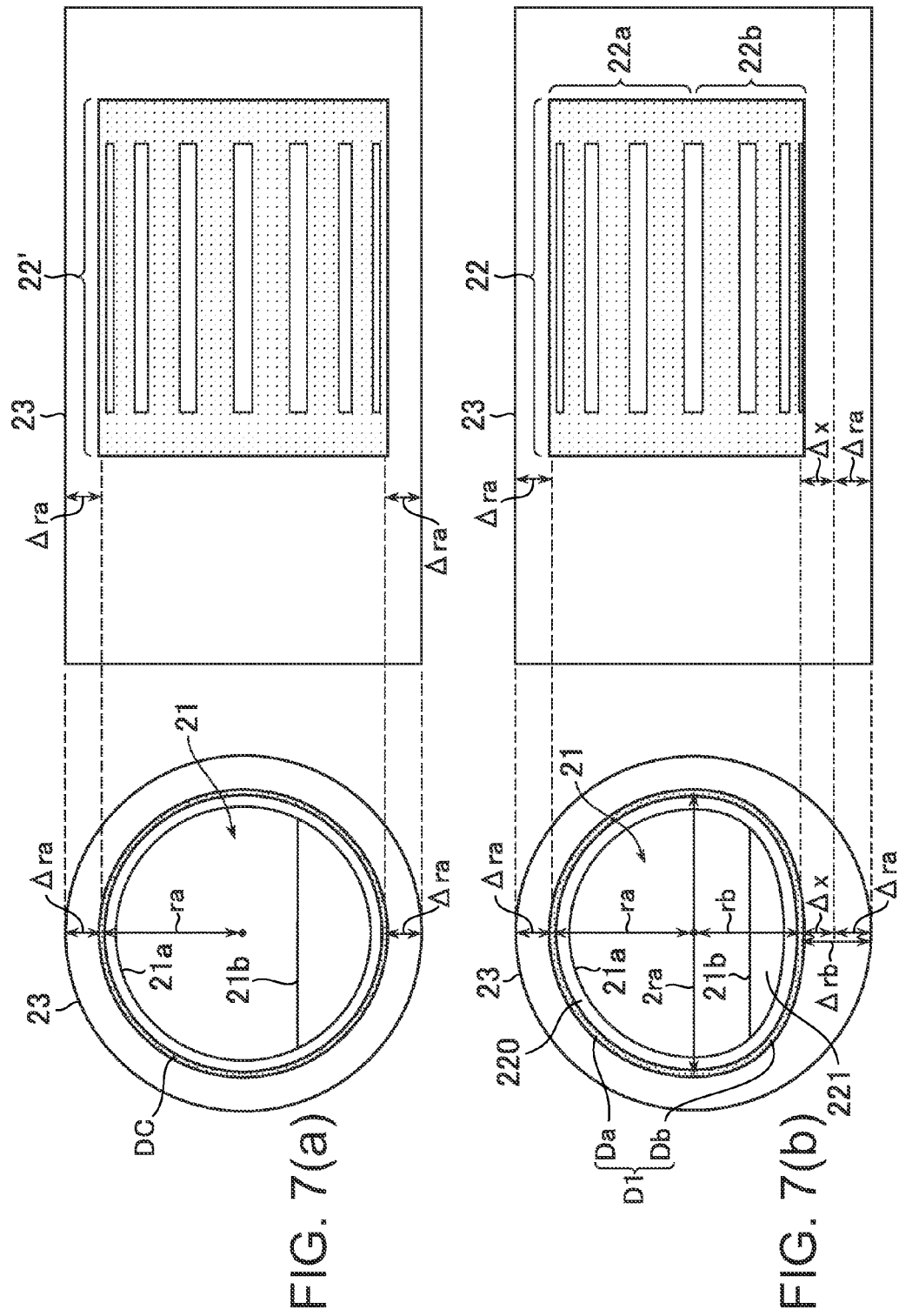

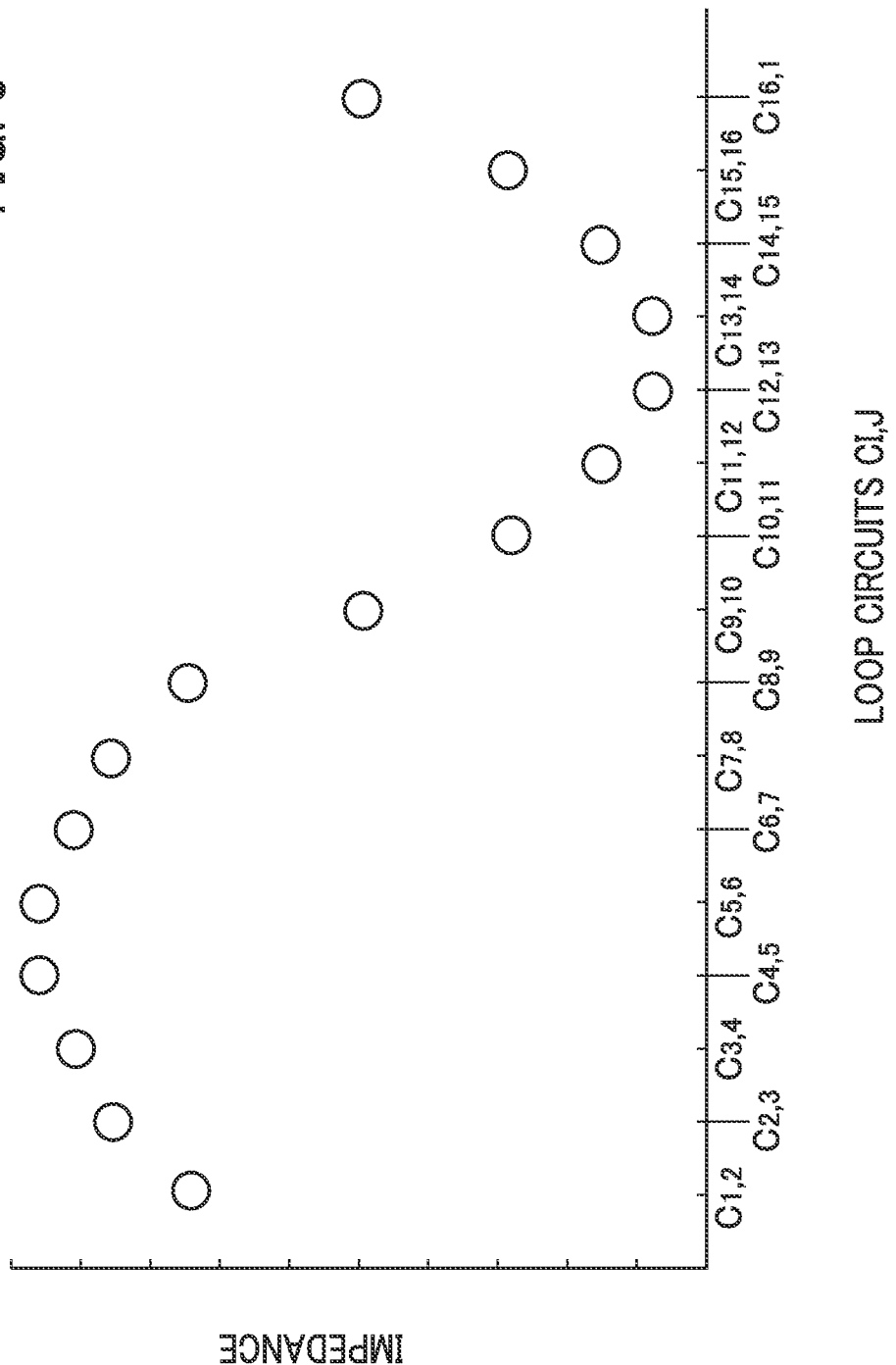

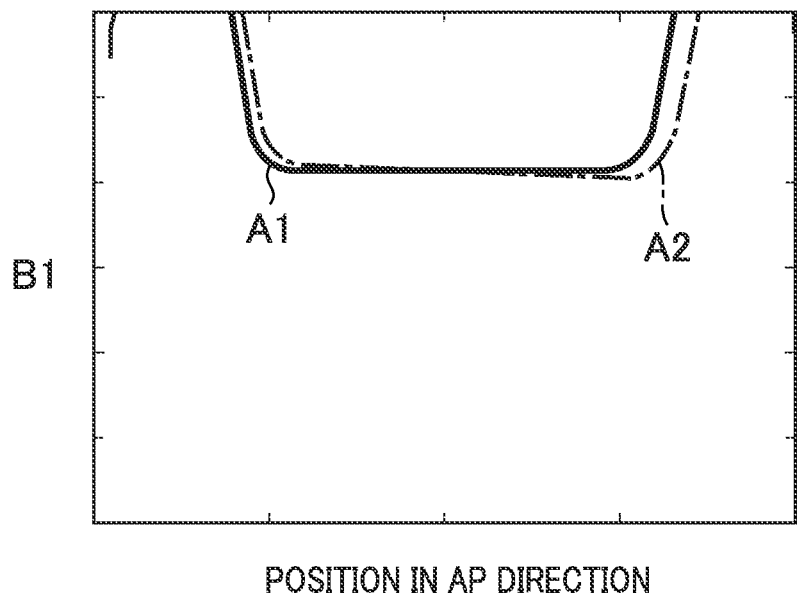

BIRDCAGE COIL FOR MAGNETIC RESONANCE IMAGING APPARATUS

CROSS REFERENCE TO RELATED APPLICATIONS

This application claims the benefit of Japanese Patent Application No. 2010-169901 filed Jul. 29, 2010, which is hereby incorporated by reference in its entirety.

BACKGROUND OF THE INVENTION

The embodiments described herein relate to a magnetic resonance imaging apparatus having an RF coil.

An RF coil for sending transmission pulses is installed within a magnetic resonance imaging apparatus. The diameter of the RF coil is related to the size of a bore into which a subject is carried. Therefore, the value of the RF coil diameter is very important. The bore can be made large by making the RF coil diameter large, thus making it possible to diminish the sense of oppression of a subject when carried into the bore. However, if the RF coil diameter is made large, it is required to increase the electric power to be supplied to the RF coil, thus giving rise to the problem that electric power consumption increases. Moreover, since an RF shield is disposed around the RF coil, if the RF coil diameter is made large, the spacing between the RF coil and the RF shield becomes narrower. The RF shield acts to cancel a magnetic field generated by the RF coil, and the narrower the spacing between the RF coil and the RF shield, the more remarkable the action of the RF shield. Thus, there arises the problem that the narrower the spacing between the RF coil and the RF shield, the larger the electric power to be supplied to the RF coil, resulting in a further increase of electric power consumption.

The use of an elliptic RF coil has been proposed as a method for solving the above problem in, for example, Japanese Unexamined Patent Publication No. Hei 7 (1995)-222729.

However, since the RF coil described in Japanese Unexamined Patent Publication No. Hei 7 (1995)-222729 is elliptic, the coil diameter in the minor axis direction of the ellipse cannot be made large. Accordingly, there is the problem that the bore cannot be made large in the minor axis direction of the ellipse and that therefore a subject who has been carried into the bore is apt to have a sense of oppression.

BRIEF DESCRIPTION OF THE INVENTION

The embodiments described herein provide a magnetic resonance imaging apparatus including: a bore for accommodating a subject; an RF coil disposed around the bore; and an RF shield disposed around the RF coil, the RF coil being constructed such that a portion of the RF coil disposed on a lower surface side of the bore is spaced more distant from the RF shield than a portion of the RF coil disposed on an upper surface side of the bore.

By constructing the RF coil as above it is possible to decrease electric power consumption of the RF coil while ensuring a required size of the bore.

Further objects and advantages of the embodiments described herein will be apparent from the following description of embodiments of the invention as illustrated in the accompanying drawings.

BRIEF DESCRIPTION OF THE DRAWINGS

FIG. 5(a) and FIG. 5(b) are diagrams explanatory of the shape of the birdcage coil 22 and that of the RF shield 23.

FIG. 6(a) and FIG. 6(b) are diagrams explanatory of the shape of an upper half Da of a ring D1 and that of a lower half Db of the ring D1.

FIG. 7(a) and FIG. 7(b) are diagrams for explaining an effect obtained by the birdcage coil 22 used in the embodiment.

FIG. 8 is a graph showing conditions for simulation of an impedance distribution of the birdcage coil 22.

FIG. 9 is a diagram showing the result of the simulation.

DETAILED DESCRIPTION OF THE INVENTION

An embodiment of the invention will be described below, but the invention is not limited to the following embodiment.

Figure 1:
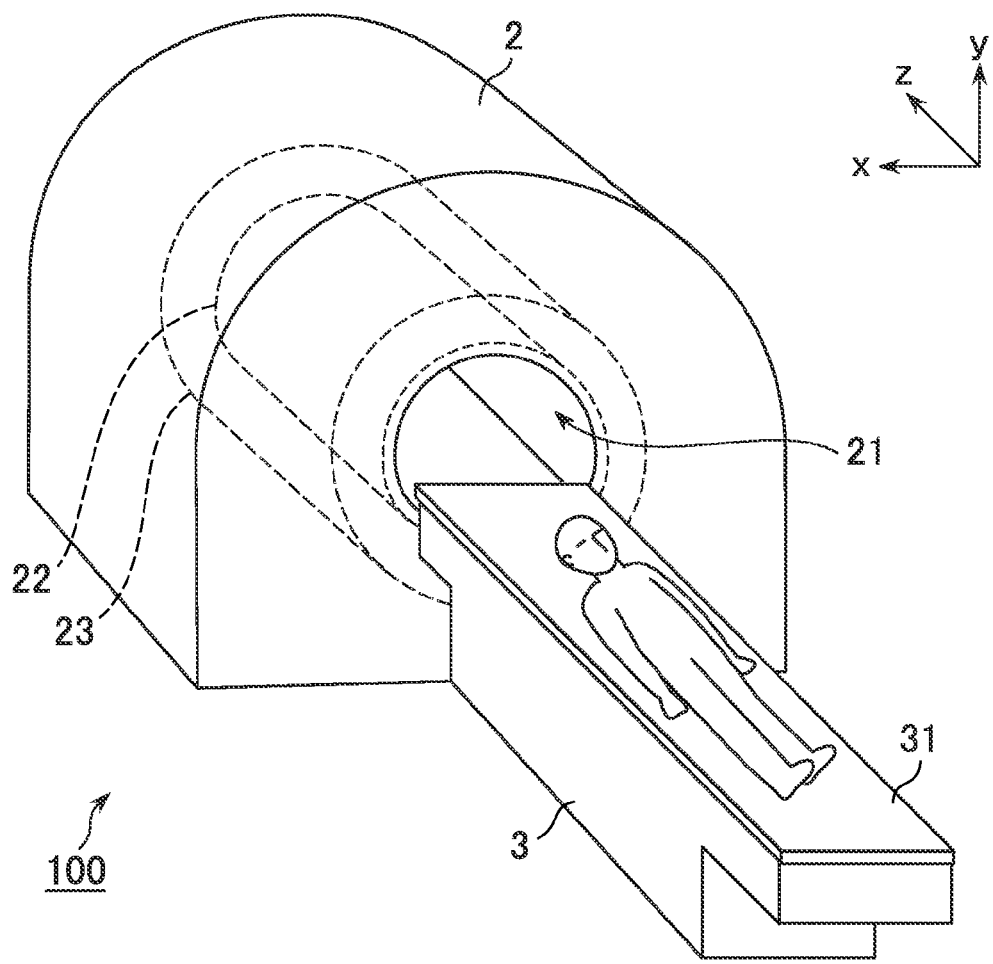
FIG. 1 is a perspective view showing a magnetic resonance imaging apparatus.

FIG. 1 is a perspective view showing a magnetic resonance imaging apparatus.

The magnetic resonance imaging apparatus (hereinafter referred to as "MRI apparatus," MRI: Magnetic Resonance Imaging) indicated at 100 has a magnetic field generator 2 and a table 3.

The magnetic field generator 2 is provided with a bore 21 for accommodating a subject. Within the magnetic field generator 2, a birdcage coil 22 for transmission of RF pulses and reception of magnetic resonance signals from the subject and an RF shield 23 for decreasing RF power radiated outside the MRI apparatus 100 are installed.

Figure 2:
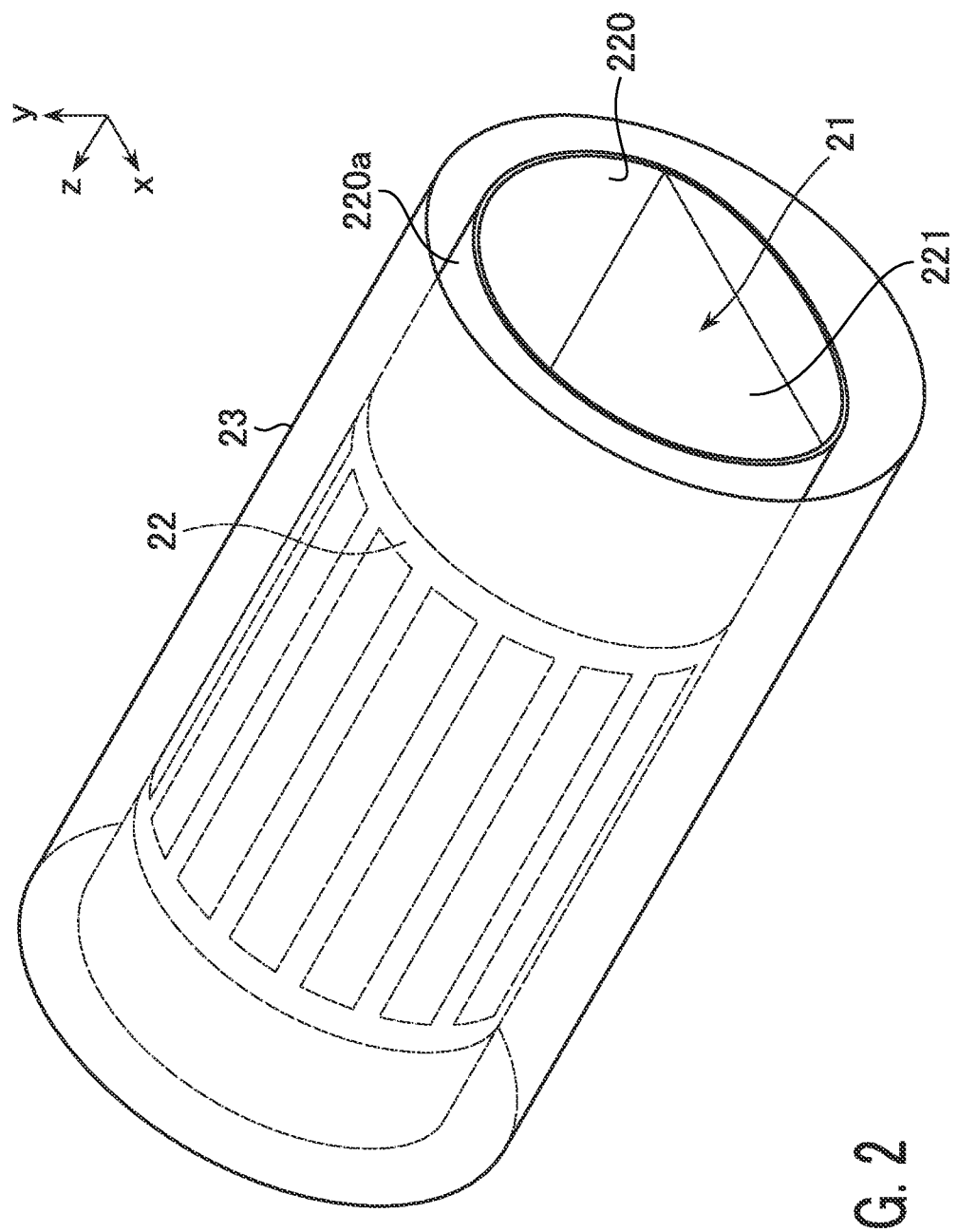
FIG. 2 is a diagram explaining a positional relation between a birdcage coil 22 and an RF shield 23.
Figure 3:
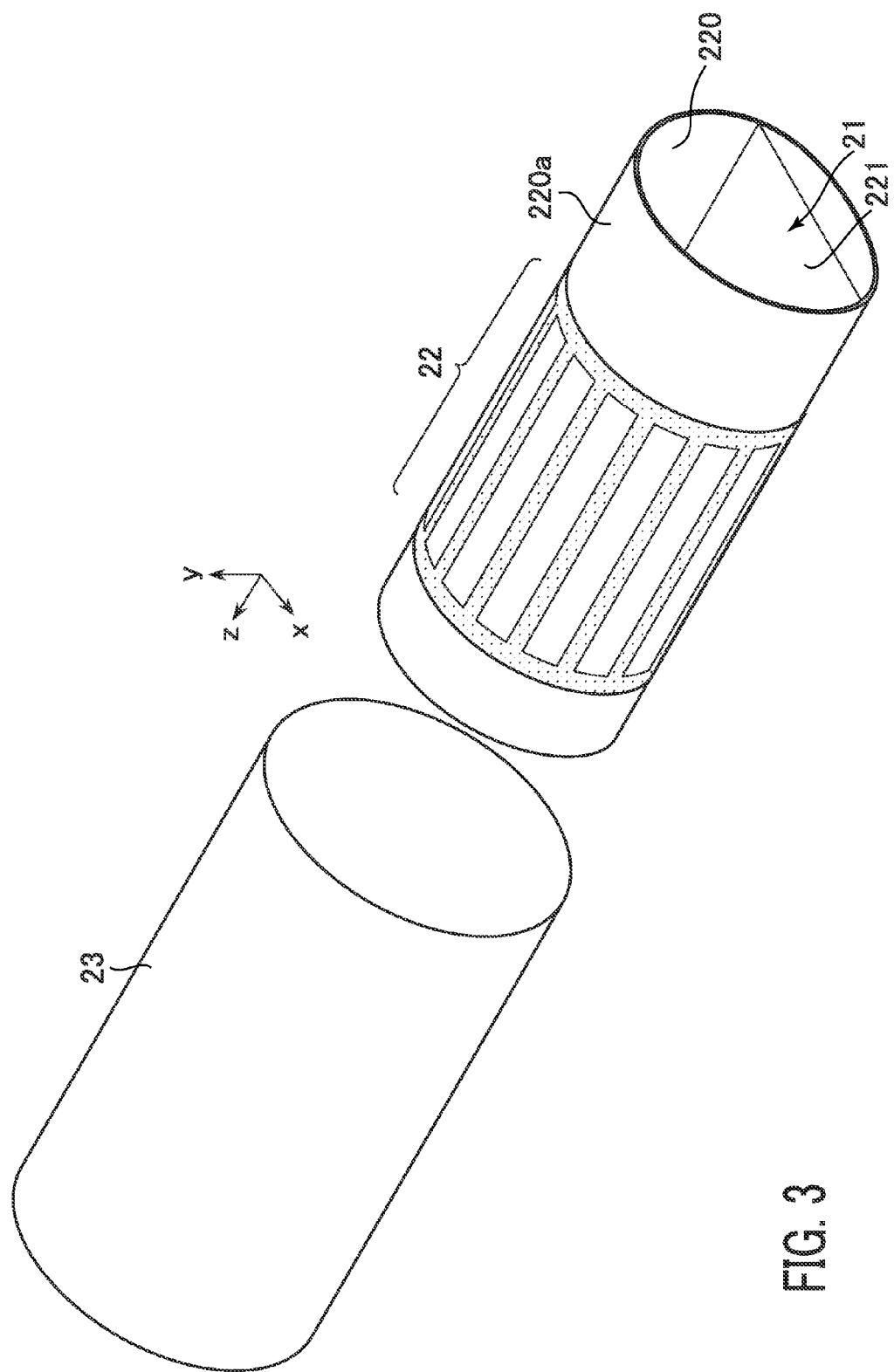
FIG. 3 is a diagram showing a state in which the RF shield 23 has been displaced backward with respect to the birdcage coil 22.

FIG. 2 is a diagram explaining a positional relation between the birdcage coil 22 and the RF shield 23 and FIG. 3 is a diagram showing a state in which the RF shield 23 has been displaced backward with respect to the birdcage coil 22.

The magnetic field generator 2 has a coil support 220 for supporting the birdcage coil 22. The coil support 220 is cylindrical, and inside the coil support 220 is mounted a cradle support base 221 for supporting a cradle 31 (see FIG. 1) within the bore 21. The space surrounded by the coil support 220 and the cradle support base 221 forms the bore 21 for accommodating the subject. The birdcage coil 22 is provided on an outer surface 220a of the coil support 220. The RF shield 23 is disposed around the birdcage coil 22.

Figure 4B:
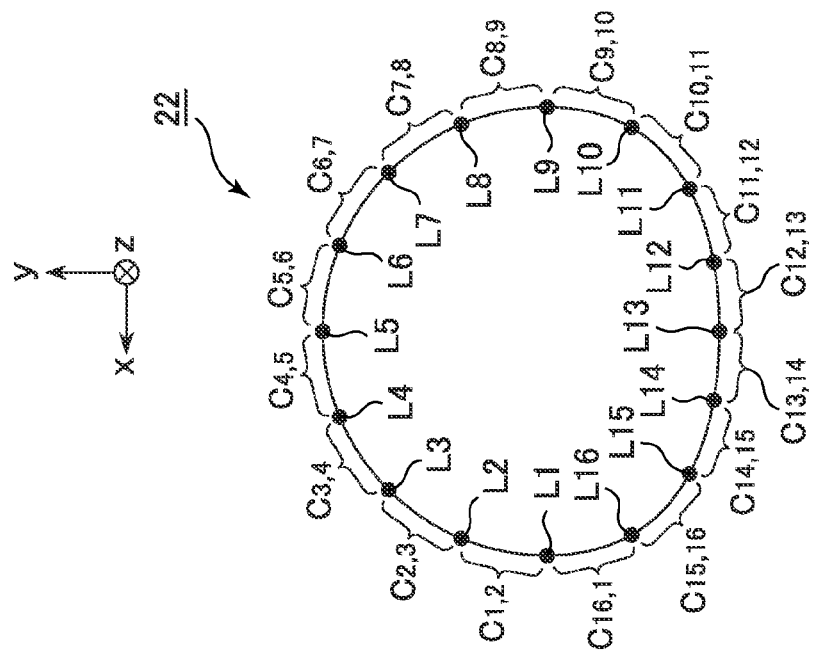
FIG. 4(a) and FIG. 4(b) are diagrams showing the birdcage coil 22.
Figure 4A:
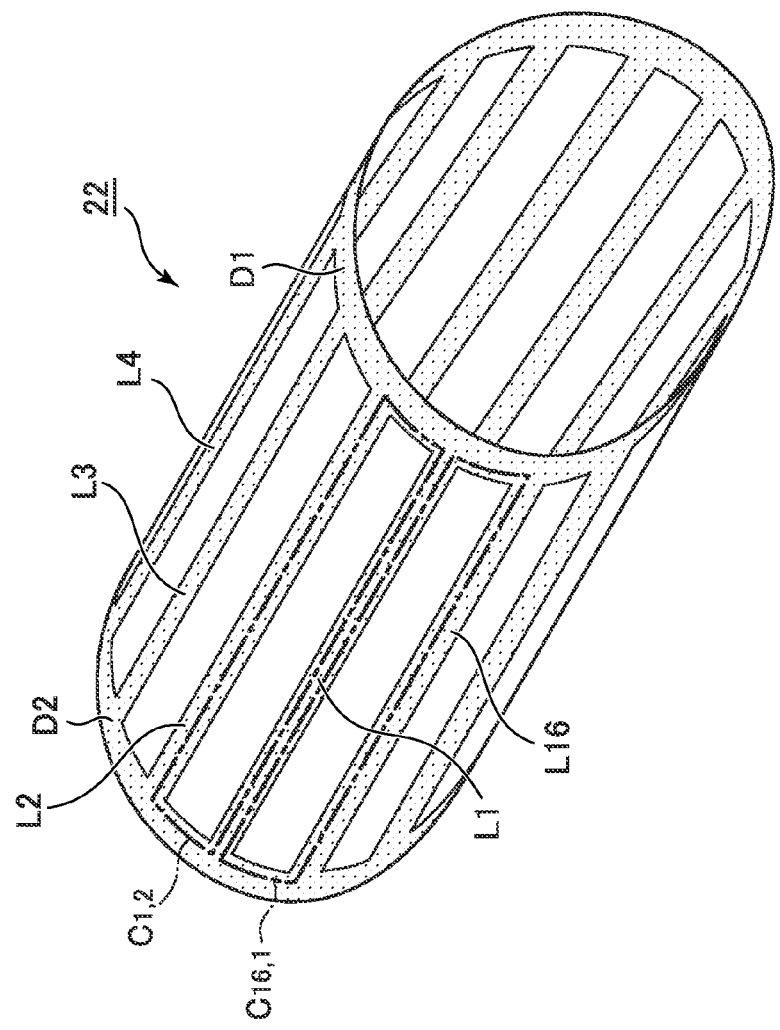

FIG. 4(a) is a perspective view of the birdcage coil 22 and FIG. 4(b) is a diagram showing which positions legs L1 to L16 assume when the birdcage coil 22 is seen from a front side.

The birdcage coil 22 has two rings D1, D2 and n number of legs Li (i=1 to n) for connecting the two rings D1 and 2 with each other. In this embodiment, n is set at 16. Therefore, the birdcage coil 22 has sixteen legs L1 to L16.

The birdcage coil 22 has loop circuits Ci,j. Each loop circuit Ci,j is formed using adjacent legs Li, Lj and the rings D1, D2. For example, a loop circuit C1,2 is formed using two adjacent legs L1, L2 and the two rings D1, D2, and a loop circuit C16, 1 is formed using two legs L16, L1 and the two rings D1, D2. In FIG. 4(a), a route of the loop circuit C1, 2 and that of the loop circuit C16, 1 are shown schematically using dot-dash lines.

Next, a description will be given below about the shape of the birdcage coil 22 and that of the RF shield 23.

FIG. 5(*a*) is a view of the birdcage coil 22 and the RF shield 22 as shown in FIG. 2 as seen in a z direction and FIG. 5(*b*) is a sectional view taken on line A-A in FIG. 5(*a*).

As shown in FIG. 5(*a*), the RF shield 23 has a circular shape when seen in the z direction. More specifically, the RF shield has a circular shape of radius r1 centered on a reference axis A.

On the other hand, the ring D1 of the birdcage coil 22 is constructed so that an upper half Da (a portion positioned on an upper surface 21*a* side of the bore 21) of the ring D1 and a lower half Db (a portion positioned on a lower surface 21*b* side of the bore 21) of the ring D1 provide an asymmetric shape.

FIG. 6(*a*) is a diagram explanatory of the shape of the upper half Da of the ring D1 and FIG. 6(*b*) is a diagram explanatory of the shape of the lower half Db of the ring D1. In FIG. 6(*a*), the upper half Da of the ring D1 is indicated with a solid line and the lower half Db of the ring D1 is indicated with a broken line. On the other hand, in FIG. 6(*b*), the upper half Da of the ring D1 is indicated with a broken line and the lower half Db of the ring D1 is indicated with a solid line.

As shown in FIG. 6(*a*), the upper half Da of the ring D1 has an upper half shape (semi-circular shape) of a circle of radius ra centered on a reference axis A. On the other hand, as shown in FIG. 6(*b*), the lower half Db of the ring D1 has a lower half shape (semi-elliptic shape) of an ellipse having a major axis length of 2ra (twice the ra) and a minor axis length of rb (<ra). Therefore, the lower half Db of the ring D1 is spaced more distant from the RF shield 23 than the upper half Da. In this embodiment, the upper half Da of the ring D1 is spaced $\Delta$ra from the RF shield 23, but the lower half Db of the ring D1 is spaced a maximum of $\Delta$rb (=$\Delta$ra+$\Delta$x) from the RF shield 23. Thus, the lower half Db of the ring D1 is further spaced a maximum of $\Delta$x from the RF shield 23.

Although the ring D1 is illustrated in FIGS. 6(*a*) and 6(*b*), the other ring D2 (shown in FIG. 4(*a*)) also has the same shape as the ring D1.

Therefore, as shown in FIG. 5(*b*), a lower half (the portion positioned on the lower surface 21*b* side of the bore 21) 22*b* of the birdcage coil 22 is further spaced a maximum of $\Delta$x from the RF shield 23 with respect to an upper half (the portion positioned on the upper surface 21*a* side of the bore 21) 22*a* of the birdcage coil 22. By thus constructing the birdcage coil 22 there is obtained an effect that the electric power consumption of the birdcage coil 22 can be reduced while making the subject-accommodating bore as wide as possible. The reason why this effect is obtained will be explained below with reference to FIGS. 7(*a*) and 7(*b*).

FIG. 7(*a*) is a diagram showing the RF shield 23 and the birdcage coil 22 having a circular ring DC and FIG. 7(*b*) is a diagram showing the RF shield 23 and the birdcage coil 22 having the ring D1.

In the case of a birdcage coil 22' shown in FIG. 7(*a*), the larger the coil diameter ra, the wider can be the bore 21, so that the sense of oppression which the subject has within the bore 21 can be diminished. However, there is the problem that the larger the coil diameter ra, the smaller the magnetic field generated at the coil center. Moreover, as the coil diameter ra is made larger, the spacing $\Delta$ra between the birdcage coil 22' and the RF shield 23 becomes narrower. The RF shield 23 acts to cancel the magnetic field generated by the birdcage coil, and the narrower the spacing $\Delta$ra, the more remarkable the action. Therefore, in order to prevent the magnetic field generated at the coil center from becoming small, it is necessary to supply a larger electric power to the birdcage coil 22'. As a result, there arises the problem that the electric power consumption increases.

On the other hand, in FIG. 7(*b*), the lower half 22*b* of the birdcage coil 22 is constructed so as to be further spaced a maximum of $\Delta$x from the RF shield 23 with respect to the upper half 22*a* of the birdcage coil 22. Therefore, by an amount of $\Delta$x, the action of the magnetic field being cancelled by the RF shield 23 can be diminished and hence it is possible to decrease the electric power consumption of the birdcage coil 22.

Since the lower half 22*b* of the birdcage coil 22 and the upper half 22*a* of the birdcage coil 22 are asymmetric in shape, there sometimes is a case where the uniformity of the magnetic field is disordered. Once the uniformity of the magnetic field is disordered, a bad influence is exerted on the image quality. Therefore, it is desirable that the magnetic field be as uniform as possible. The magnetic field can be made as uniform as possible by adjusting the impedance distribution of the birdcage coil 22 so that the impedance of the upper half 22*a* of the birdcage coil 22 becomes high, while the impedance of the lower half 22*b* of the birdcage coil 22 becomes low. For example, in connection with the loop circuits Ci,j (see FIG. 4(*b*)) of the birdcage coil 22, the above impedance distribution can be achieved by making the loop circuits C1,2 to C8,9 high in impedance and the loop circuits C9,10 to C16,1 low in impedance. By so adjusting the impedance distribution of the birdcage coil 22 it is possible to enhance the uniformity of the magnetic field. Next, simulation has been conducted to verify that the uniformity of the magnetic field can be enhanced by adjusting the impedance distribution. The following description is provided about conditions and result of the simulation.

FIG. 8 is a graph showing conditions for simulation of the impedance distribution of the birdcage coil 22.

In the graph of FIG. 8, the loop circuits Ci,j of the birdcage coil 22 are plotted along the axis of abscissa, while the impedances of the loop circuits Ci,j are plotted along the axis of ordinate. As shown in the graph of FIG. 8, the loop circuits C1, to C8,9 are set high in impedance, while the loop circuits C9,10 to C16,1 are set low in impedance. Particularly, in the simulation conducted this time, the impedances are set so that the loop circuits C4,5 and C5,6 located at the highest position are the highest in impedance and the loop circuits C12, 13 and C13, 14 located at the lowest position are the lowest in impedance.

In FIG. 7(*b*), the spacings $\Delta$ra and $\Delta$rb between the birdcage coil 22 and the RF shield 23 are set so as to satisfy the relationship of $\Delta$ra:$\Delta$rb=1:2.

FIG. 9 is a diagram showing the result of the simulation.

In the graph of FIG. 9, the position of the bore 21 in AP direction is plotted along the axis of abscissa, while the strength of a magnetic field B1 generated by the birdcage coil is plotted along the axis of ordinate. A solid curve A1 in the graph indicates the strength of a magnetic field B1 generated by the conventional birdcage coil 22' shown in FIG. 7(*a*), while a dot-dash line curve A2 in the graph indicates the strength of a magnetic field B1 generated by the birdcage coil 22 according to this embodiment which has the impedance distribution shown in FIG. 8. Comparison between both curves A1 and A2 shows that there are obtained almost the same magnetic field strengths. Thus, it is seen that the magnetic field strength distribution can be made sufficiently uniform by adjusting like FIG. 8 the impedance distribution of the birdcage coil 22 used in this embodiment. The impedance distribution of the birdcage coil 22 can be adjusted for example by adjusting the capacitance and inductance of the birdcage coil 22.

In the birdcage coil 22 according to this embodiment, the upper half Da of the ring D1 has a semi-circular shape (see FIG. 6(a) and the lower half Db of the ring D1 has a semi-elliptic shape (see FIG. 6(b)). However, the shape of the ring D1 is not limited to the shape shown in FIGS. 6(a) and 6(b). It may be another shape. Reference will be made below to an example of a ring D1 having another shape.

Figure 10:
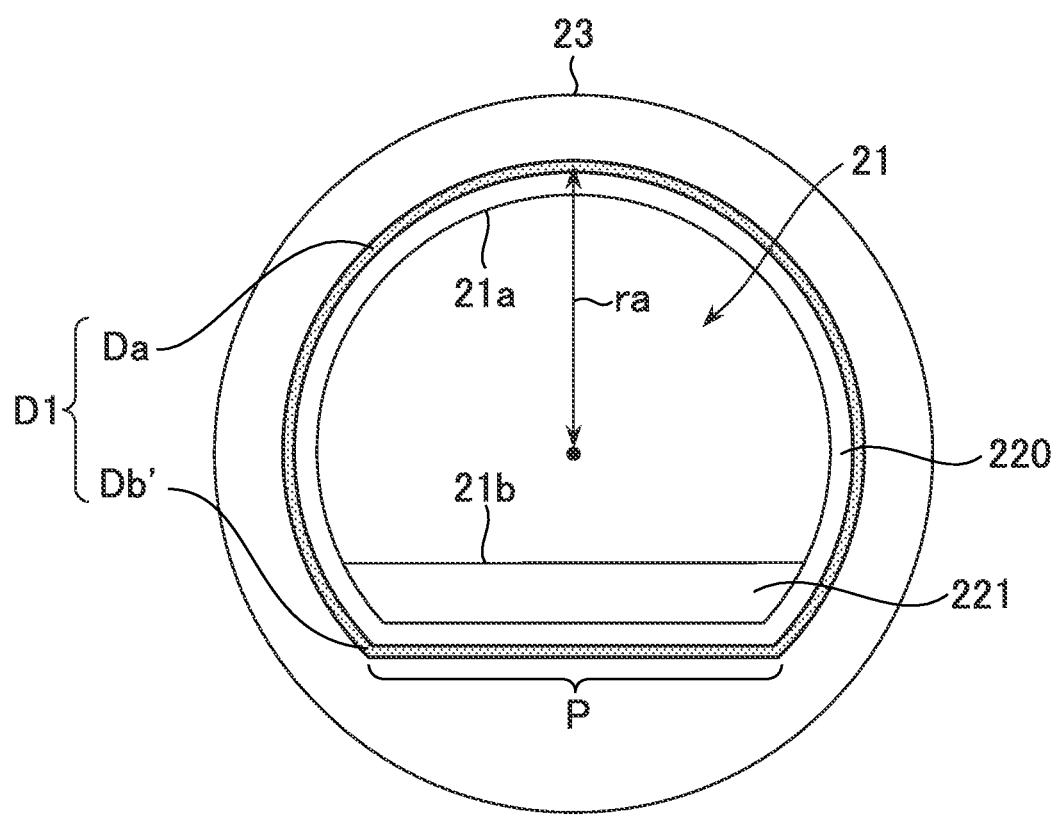
FIG. 10 is a diagram showing an example of a ring D1 having another shape.

FIG. 10 is a diagram showing an example of a ring D1 having another shape.

An upper half Da of the ring D1 has a semi-circular shape like the ring D1 shown in FIGS. 6(a) and 6(b). However, unlike the ring D1 shown in FIGS. 6(a) and 6(b), a lower half Db' of the ring D1 has a rectilinearly extending portion P. Thus, various changes may be made as to the ring shape of the birdcage coil 22.

Although in the above embodiment there is shown an example of using the birdcage coil 22 as the RF coil, the RF coil used in the invention may be an RF coil other than the birdcage coil.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus comprising:
    a bore configured to accommodate a subject therein;
    a birdcage coil positioned about the bore; and
    an RF shield having a cylindrical shape positioned about the birdcage coil,
    wherein the birdcage coil comprises a first portion positioned adjacent a lower surface side of the bore and radially spaced a first distance from the RF shield and a second portion positioned adjacent an upper surface side of the bore and radially spaced a second distance from the RF shield, wherein the first distance is larger than the second distance.

2. A magnetic resonance imaging apparatus according to claim 1, wherein the first portion of the birdcage coil has a smaller impedance than an impedance of the second portion of the birdcage coil.

3. A magnetic resonance imaging apparatus according to claim 2, wherein the birdcage coil comprises:
    a first ring and a second ring both positioned about the bore; and
    a plurality of legs connecting the first and second rings with each other.

4. A magnetic resonance imaging apparatus according to claim 3, wherein the birdcage coil comprises a plurality of loop circuits including the first and second rings and a plurality of legs, a first portion of loop circuits of the plurality of loop circuits that is positioned adjacent the lower surface side of the bore having a smaller impedance than an impedance of a second portion of loop circuits of the plurality of loop circuits that is positioned adjacent the upper surface side of the bore.

5. A magnetic resonance imaging apparatus according to claim 4, wherein an upper loop circuit of the plurality of loop circuits that is located at a highest position has a largest impedance and a lower loop circuit of the plurality of loop circuits that is located at a lowest position has a smallest impedance.

6. A magnetic resonance imaging apparatus according to claim 3, wherein:
    an upper half of the first ring and an upper half of the second ring are semi-circular in shape; and
    a lower half of the first ring and a lower half of the second ring are semi-elliptic in shape.

7. A magnetic resonance imaging apparatus according to claim 6, wherein the birdcage coil comprises a plurality of loop circuits including the first and second rings and a plurality of legs, a first portion of loop circuits of the plurality of loop circuits that is positioned adjacent the lower surface side of the bore having a smaller impedance than an impedance of a second portion of loop circuits of the plurality of loop circuits that is positioned adjacent the upper surface side of the bore.

8. A magnetic resonance imaging apparatus according to claim 7, wherein an upper loop circuit of the plurality of loop circuits that is located at a highest position has a largest impedance and a lower loop circuit of the plurality of loop circuits that is located at a lowest position has a smallest impedance.

9. A magnetic resonance imaging apparatus according to claim 1, wherein the birdcage coil comprises:
    a first ring and a second ring both positioned about the bore; and
    a plurality of legs connecting the first and second rings with each other.

10. A magnetic resonance imaging apparatus according to claim 9, wherein:
    an upper half of the first ring and an upper half of the second ring are semi-circular in shape; and
    a lower half of the first ring and a lower half of the second ring are semi-elliptic in shape.

11. A magnetic resonance imaging apparatus according to claim 10, wherein the RF birdcage coil comprises a plurality of loop circuits including the first and second rings and a plurality of legs, a first portion of loop circuits of the plurality of loop circuits that is positioned adjacent the lower surface side of the bore having a smaller impedance than an impedance of a second portion of loop circuits of the plurality of loop circuits that is positioned adjacent the upper surface side of the bore.

12. A magnetic resonance imaging apparatus according to claim 11, wherein an upper loop circuit of the plurality of loop circuits that is located at a highest position has a largest impedance and a lower loop circuit of the plurality of loop circuits that is located at a lowest position has a smallest impedance.

13. A magnetic resonance imaging apparatus according to claim 9, wherein the birdcage coil comprises a plurality of loop circuits including the first and second rings and a plurality of legs, a first portion of loop circuits of the plurality of loop circuits that is positioned adjacent the lower surface side of the bore having a smaller impedance than an impedance of a second portion of loop circuits of the plurality of loop circuits that is positioned adjacent the upper surface side of the bore.

14. A magnetic resonance imaging apparatus according to claim 13, wherein an upper loop circuit of the plurality of loop circuits that is located at a highest position has a largest impedance and a lower loop circuit of the plurality of loop circuits that is located at a lowest position has a smallest impedance.

* * * * *